United States Patent
Jeong et al.

(10) Patent No.: US 7,522,447 B2
(45) Date of Patent: Apr. 21, 2009

(54) MAGNETIC MEMORY DEVICES AND METHODS OF FORMING THE SAME

(75) Inventors: Won-Cheol Jeong, Seoul (KR); Jae-hyun Park, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 469 days.

(21) Appl. No.: 11/257,841

(22) Filed: Oct. 25, 2005

(65) Prior Publication Data
US 2006/0097333 A1    May 11, 2006

(30) Foreign Application Priority Data
Oct. 26, 2004    (KR) .................. 10-2004-0085754

(51) Int. Cl.
*G11C 11/00* (2006.01)
(52) U.S. Cl. .............. 365/158; 365/171; 365/173
(58) Field of Classification Search .......... 365/158, 365/171, 173; 257/427
See application file for complete search history.

(56) References Cited

U.S. PATENT DOCUMENTS

| | | | |
|---|---|---|---|
| 6,703,429 B2 | 3/2004 | O'Rear et al. | |
| 2002/0155627 A1 | 10/2002 | Okazawa et al. | |
| 2004/0108561 A1* | 6/2004 | Jeong ................ | 257/422 |
| 2004/0188799 A1* | 9/2004 | Seyyedy et la. ...... | 257/530 |

FOREIGN PATENT DOCUMENTS

| | | |
|---|---|---|
| JP | 2002314049 | 10/2002 |
| JP | 2003086773 | 3/2003 |
| JP | 2003-347518 | 12/2003 |
| KR | 2003-0009106 | 1/2003 |
| KR | 100399439 | 9/2003 |
| KR | 10-2004-0041335 | 5/2004 |

* cited by examiner

*Primary Examiner*—Son Dinh
(74) *Attorney, Agent, or Firm*—Mills & Onello LLP

(57) ABSTRACT

A magnetic memory device includes bottom electrodes disposed on an interlayer dielectric on a substrate. The bottom electrodes are spaced apart from one another in one direction as much as a first distance. A planarized insulation layer fills spaces between the bottom electrodes and has a top surface coplanar with a top surface of the bottom electrode. Magnetic tunnel junction (MTJ) patterns are connected to the bottom electrodes, respectively, and are spaced apart from one another in the one direction as much as a second distance. The first distance is equal to the second distance.

17 Claims, 12 Drawing Sheets

MAGNETIC MEMORY DEVICES AND METHODS OF FORMING THE SAME

PRIORITY STATEMENT

This application claims priority of Korean Patent Application No. 2004-85754, filed on Oct. 26, 2004 in the Korean Intellectual Property Office, the contents of which are incorporated herein in their entirety by reference.

BACKGROUND OF THE INVENTION

1. Field of the Invention

The present invention relates to a semiconductor device and a method of forming the same. More specifically, the present invention is directed to magnetic memory devices and methods of forming the same.

2. Description of Related Art

Magnetic memory devices write or erase data using magnetic fields. Magnetic memory devices are high-speed readable and writable and freely rewritable memory devices. Magnetic memory devices are non-volatile memory devices that continuously hold their stored data even when their power supplies are interrupted.

A unit cell of a magnetic memory device mainly uses a magnetic tunnel junction (MTJ) pattern as data storage. The MTJ pattern includes two ferromagnetic substances and a dielectric substance interposed therebetween. Resistance of the MTJ pattern varies with magnetization directions of the two ferromagnetic substances. Assuming that a resistance when the magnetization directions are identical to each other is R1 and a resistance when they are different from each other is R2, the resistance R1 is lower than the resistance R2. A difference between currents flowing through the MTJ pattern, based on the resistance variation, is sensed to determine whether data stored in a magnetic memory cell is logic "1" or "0".

A typical magnetic memory device includes a digit line and a bitline for inducing a magnetic field applied to an MTJ pattern. The digit line and the bitline are intersected and are disposed under and over the MTJ pattern, respectively.

FIG. 1 is a top plan view of a conventional magnetic memory device, and FIG. 2 is a cross-sectional view taken along a line I-I' of FIG. 1.

As illustrated in FIG. 1 and FIG. 2, a lower oxide layer 2 is disposed on a substrate 1. A digit line 3 is disposed over the lower oxide layer 2. An intermediate oxide layer 4 is disposed to cover the digit line 3 and the lower oxide layer 2. A contact hole 5 is formed to expose a predetermined area of the substrate 1 through the intermediate oxide layer 4 and the lower oxide layer 2. A contact plug 6 is formed to fill the contact hole 5.

The contact plug 6 is disposed to be spaced apart from one side of the digit line 3. The contact plug 6 is electrically connected to a switching element (not shown, e.g., a source/drain region of a MOSFET) formed below the lower oxide layer 2.

A plurality of bottom electrodes 7 are disposed on the intermediate oxide layer 4 in a parallel direction with the digit line 3. The bottom electrodes 7 are spaced apart from one another. The bottom electrode 7 is connected to the contact plug 6 and extends laterally to cover the the digit line 3. The digit line 3 and the bottom electrode 7 are isolated by the intermediate oxide layer 4. A magnetic tunnel junction (MTJ) pattern 11 is disposed on the bottom electrode 7. The MTJ pattern 11 is aligned over the digit line 3. The bottom electrode 7 is connected to an entire top surface of the contact plug 6 as well as an entire bottom surface of the MTJ pattern 11.

The MTJ pattern 11 includes a first magnetic layer 8 and a second magnetic layer 10, stacked in that order, and a dielectric layer 9 interposed therebetween. A magnetization direction of the first magnetic layer 8 is fixed, and a magnetization direction of the second layer 10 freely varies with external magnetic fields.

An upper oxide layer 12 is disposed to cover an entire surface of the substrate 1. A top surface of the upper oxide layer 12 is level with a top surface of the MTJ pattern 11, and the top surface of the MTJ pattern 11 is exposed.

A bitline 13 is disposed on the upper oxide layer 12 to cross the digit line 3. The bitline 13 is electrically connected to the MTJ pattern 11. The MTJ pattern 11 is disposed at an intersection of the bitline 13 and the digit line 3. For the convenience of description, a digit line 3 and a bitline 13 of FIG. 2 are not shown in FIG. 1.

Magnetic fields established by the bitline 13 and the digit line 3 change a magnetization direction of the second magnetic layer 10. In this case, the first magnetic layer 8 is always fixed. When magnetization directions of the first and second magnetic layers 8 and 10 are identical to each other, a resistance of the MTJ pattern 11 decreases. When the magnetization directions thereof are different from each other, a resistance of the MTJ pattern 11 increases. Thus, the amount of current flowing through the MTJ pattern 11 varies, which is sensed to read data written into the MTJ pattern 11.

The MTJ pattern 11 is interposed between the digit line 3 and the bitline 13 and is electrically connected to the contact plug 6 and the bitline 13. Since the contact plug 6 is laterally spaced apart from the digit line 3, the bottom electrode 7 is connected to the top surface of the contact plug 7 as well as the bottom surface of the MTJ pattern 11. Due to such a structural cause, the bottom electrode 7 has a large plane area. Thus, the plane area of the bottom electrode 7 may become a significant factor in determining a plane area of a magnetic memory cell.

Conventionally, a photolithographic process may result in misalignment. Therefore, lower or upper patterns formed using the photolithographic process include a region for securing a misalignment margin region (hereinafter referred to as "misalign margin region"). The contact hole 8, the bottom electrode 7, and the MTJ pattern 11 are determined by different photolithographic processes respectively to include a misalign margin region.

A first misalign margin region m1 between the bottom electrode 7 and the MTJ pattern 11 is included in the bottom electrode 7. This is because a plane area of the bottom electrode 7 is smaller than that of the MTJ pattern 11. If the MTJ pattern 11 is misaligned with the bottom electrode 7, a characteristic of the MTJ pattern 11 may be degraded due to a step difference caused by a thickness of the bottom electrode 7. Due to the first misalign margin region m1, the plane area of the bottom electrode 7 increases more and a space 15b between adjacent MTJ patterns 11 may be greater than a space 15a between adjacent bottom electrodes 7.

In view of the fact that the plane area of the bottom electrode 7 is larger than that of the contact hole 5, a second misalign margin region m2 between the bottom electrode 7 and the contact hole 5 may be included in the bottom electrode 7. Due to the second misalign margin region m2, the plane area of the bottom electrode 7 may increase more.

Thus, conventionally, a plane area of a magnetic memory cell increases to impede high integration of a magnetic memory device.

SUMMARY OF THE INVENTION

The present invention is directed to a magnetic memory device to achieve a high integration and a method of forming the same.

I According to a first aspect, the invention is directed to a magnetic memory device which includes bottom electrodes and a planarized insulation layer. The bottom electrodes are disposed over an interlayer dielectric formed on a substrate and are arranged in one direction to be spaced apart from one another as much as a first distance. The planarized insulation layer fills spaces between the bottom electrodes and has a top surface coplanar with a top surface of the bottom electrodes. Magnetic tunnel junction (MTJ) patterns are connected to the bottom electrodes, respectively. The MTJ patterns are arranged in the one direction to be spaced apart from one another as much as a second distance. The first distance is equal to the second distance.

In some embodiments, the magnetic memory device may further include a digit line disposed below the bottom electrodes to overlap the MTJ patterns. The interlayer dielectric covers the digit line, and the digit line extends in the one direction. The magnetic memory device may further include a contact plug disposed to be spaced apart from the digit line as much as a third distance in a vertical direction with respect to the one direction to fill a contact hole penetrating the interlayer dielectric. The contact plug is connected to a bottom surface of the bottom electrode. A length of the bottom electrode disposed in the vertical direction is equal to the sum of a width of the contact hole, the third distance, and a width of the MTJ pattern. The magnetic memory device may further include a bitline connected to MTJ pattern to intersect the digit line.

In some embodiments, the MTJ pattern is rectangular, and a major axis direction of the MTJ pattern is parallel with the one direction.

In some embodiments, the MTJ pattern is rectangular, and the minor axis direction of the MTJ pattern is parallel with the one direction. In one embodiment, the magnetic memory device further comprises a digit line disposed below the bottom electrodes to overlap the MTJ patterns. The interlayer dielectric can cover the digit line, and the digit line can extend in the major axis direction of the MTJ pattern. In one embodiment, the magnetic memory device further comprises a contact plug spaced apart from the digit line in a minor axis direction of the MTJ pattern as much as a third distance to fill the contact hole penetrating the interlayer dielectric, the contact plug being connected to the bottom surface of the bottom electrode. In the minor axis direction of the MTJ pattern, a length of the bottom electrode is equal to the sum of the width of the contact hole, the third distance, and a minor axis distance of the MTJ pattern.

In one embodiment, the magnetic memory device further comprises a bitline connected to the MTJ pattern to intersect the digit line.

In one embodiment, the magnetic memory device further comprises a digit line disposed below the bottom electrodes to overlap the MTJ patterns. The interlayer dielectric can cover the digit line, and the digit line can extend in the minor axis direction of the MTJ pattern.

In one embodiment, the magnetic memory device further comprises a contact plug spaced apart from the digit line in the major axis direction of the MTJ pattern as much as a third distance to fill a contact hole penetrating the interlayer dielectric, the contact plug being connected to the bottom surface of the bottom electrode. In the major axis direction of the MTJ pattern, a length of the bottom electrode is equal to the sum of a width of the contact hole, the third distance, and a major axis length of the MTJ pattern. The contact holes can be spaced apart from one another in the minor axis direction of the MTJ pattern as much as a fourth distance that is equal to the first distance.

In one embodiment, the magnetic memory device further comprises a bitline connected to the MTJ pattern to intersect the digit line.

According to another aspect, the invention is directed to a method of forming a magnetic memory device. According to the method, bottom electrodes are formed over an interlayer dielectric layer formed on a substrate. The bottom electrodes are spaced apart from one another as much as a first distance. A planarized insulation layer is formed to fill spaces between the bottom electrodes. The planarized insulation layer has a top surface coplanar with a top surface of the bottom electrodes. Magnetic tunnel junction (MTJ) patterns are formed in one direction to be spaced apart from one another as much as a second distance. The MTJ patterns are connected to the bottom electrodes, respectively. The first distance is equal to the second distance.

In one embodiment, the MTJ pattern is rectangular, and a major axis direction of the MTJ pattern is parallel with the one direction.

In one embodiment, the method further comprises forming a digit line disposed below the bottom electrodes to overlap the MTJ patterns. The interlayer dielectric covers the digit line, and the digit line extends in the major axis direction of the MTJ pattern. In one embodiment, the method further comprises forming a contact hole spaced apart from the digit line in a minor axis direction of the MTJ pattern as much as a third distance to penetrate the interlayer dielectric; and forming a contact plug to fill the contact hole, the contact plug being connected to a bottom surface of the bottom electrode. In the minor axis direction of the MTJ pattern, a length of the bottom electrode is equal to the sum of a width of the contact hole, the third distance, and a minor axis length of the MTJ pattern.

In one embodiment, the MTJ pattern is rectangular, and a minor axis direction of the MTJ pattern is parallel with the one direction.

In one embodiment, the method further comprises forming a digit line disposed below the bottom electrodes to overlap the MTJ patterns. The interlayer dielectric covers the digit line, and the digit line extends in the minor axis direction of the MTJ pattern.

In one embodiment, the method further comprises forming a contact hole spaced apart from the digit line in the major axis direction of the MTJ pattern as much as a third distance to penetrate the interlayer dielectric; and forming a contact plug to fill the contact hole, the contact plug being connected to the bottom surface of the bottom electrode. In the major axis direction of the MTJ pattern, a length of the bottom electrode is equal to the sum of a width of the contact hole, the third distance, and a major axis length of the MTJ pattern.

In one embodiment, the contact holes are spaced apart from one another in the minor axis direction of the MTJ pattern as much as a fourth distance that is equal to the first distance.

In one embodiment, the method further comprises forming a bitline connected to the MTJ pattern to intersect the digit line.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully hereinafter with reference to the accompanying drawings, in which preferred embodiments of the invention are shown. It will be understood that when a layer is referred to as being "on" another layer or substrate, it can be directly on the other layer or substrate, or intervening layers may also be present.

EMBODIMENT 1

Figure 1:
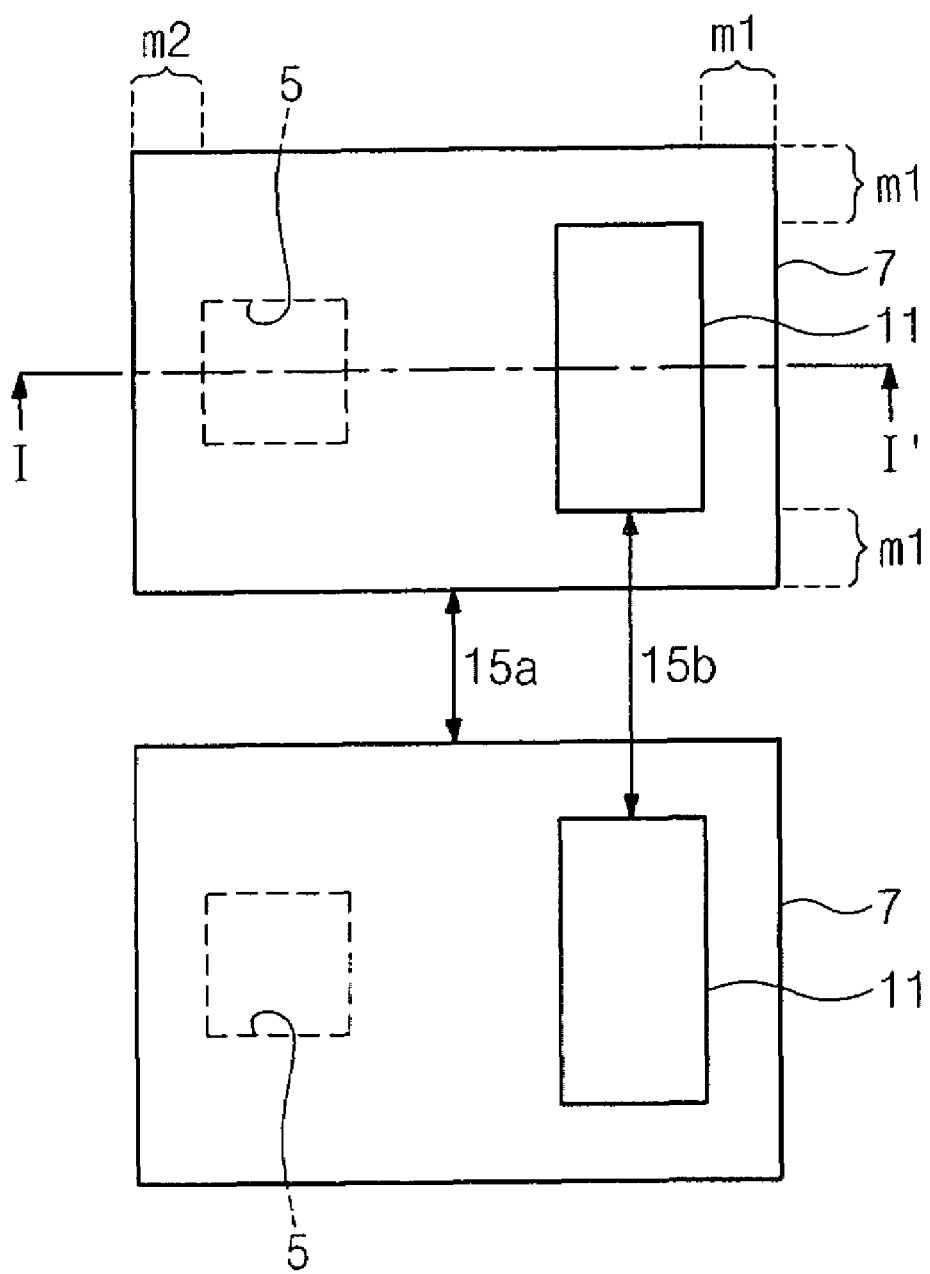
FIG. 1 is a top plan view of a conventional magnetic memory device.
Figure 2:
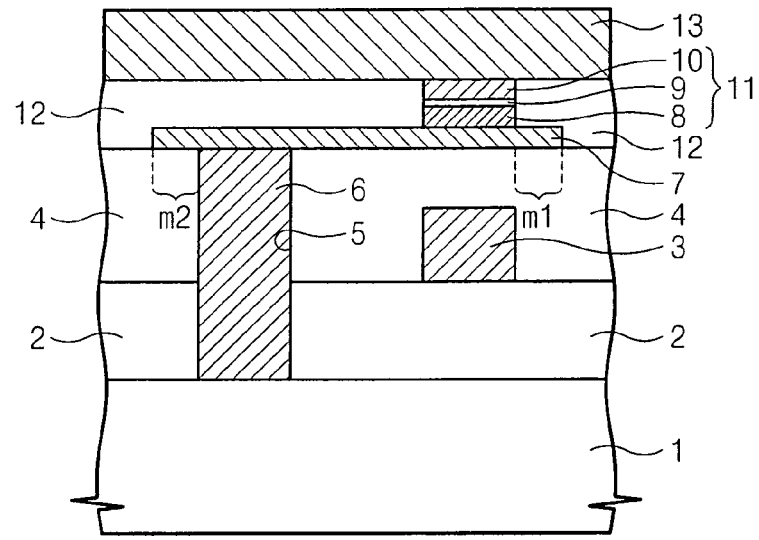
FIG. 2 is a cross-sectional view taken along a line I-I' of FIG. 1.
Figure 3:
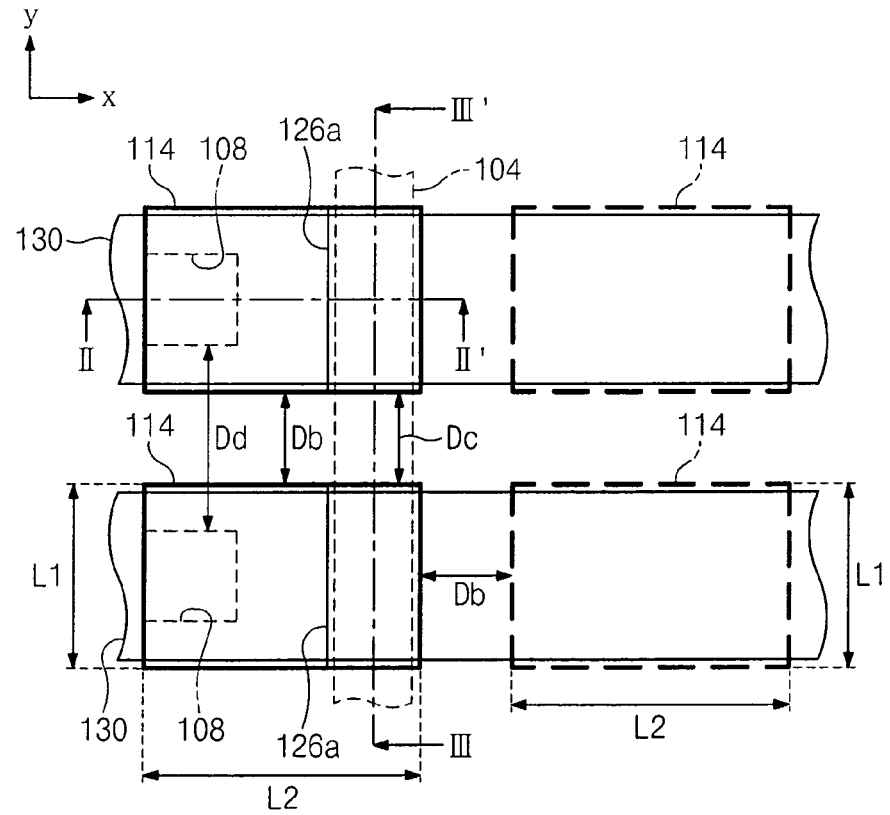
FIG. 3 is a top plan view of a magnetic memory device according to an embodiment of the present invention.
Figure 4A:
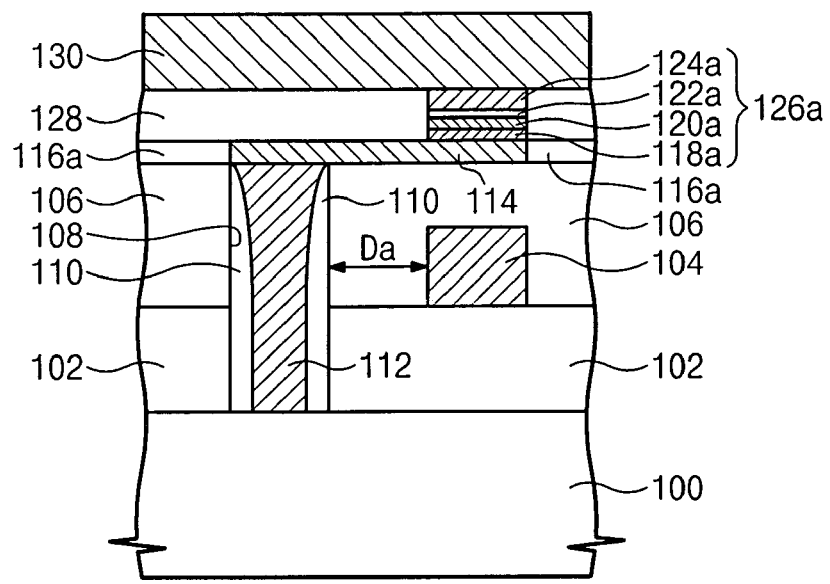
FIG. 4A is a cross-sectional view taken along a line II-II' of FIG. 3.

FIG. 3 is a top plan view of a magnetic memory device according to an embodiment of the present invention. FIG. 4A is a cross-sectional view taken along a line II-II' of FIG. 3, and FIG. 4B is a cross-sectional view taken along a line III-III' of FIG. 3.

Figure 4B:
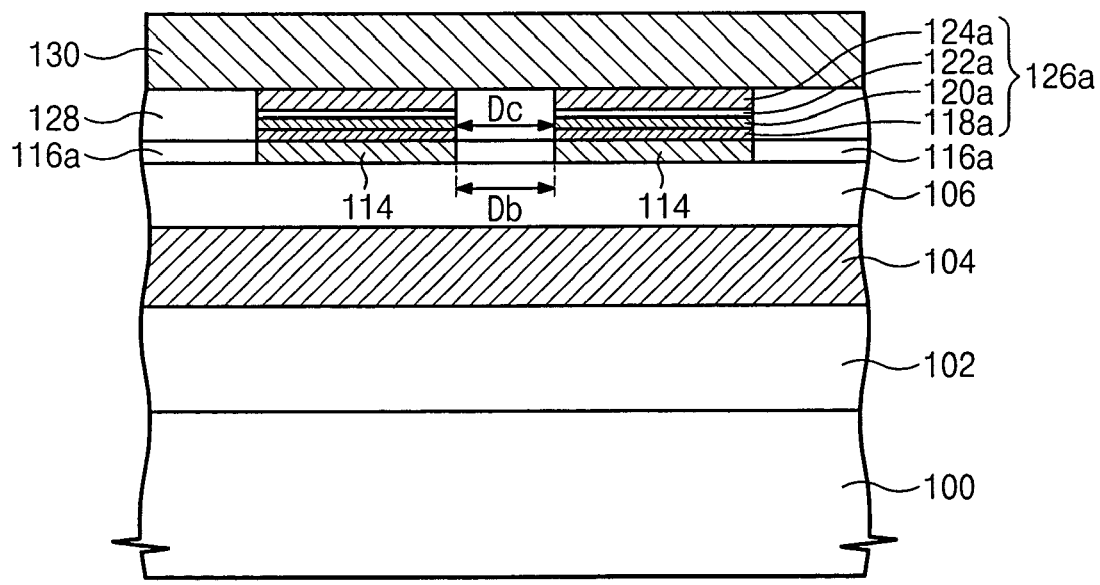
FIG. 4B is a cross-sectional view taken along a line III-III' of FIG. 3.

Referring to FIG. 3, FIG. 4A, and FIG. 4B, a first interlayer dielectric 102 is disposed on a substrate 100. A digit line 104 is disposed over the first interlayer dielectric 102. A second interlayer dielectric 106 is disposed on an entire surface of the substrate 100 to cover the first interlayer dielectric 102 and the digit line 104. A top surface of the second interlayer dielectric 106 may be a planarized surface.

A contact hole 108 is spaced from one side of the digit line 104 to penetrate the second interlayer dielectric 106. The contact plug 108 fills the contact hole 108. An insulation spacer 110 may be disposed on an inner sidewall of the contact hole 108. The contact hole 108 extends downwardly and thus penetrates the first interlayer dielectric 102 to expose the substrate is 100. In this case, the contact plug 112 also extends downwardly and thus fills an extending portion of the contact hole 108 to be connected to the substrate 100. The insulation spacer 110 also extends downwardly to cover an inner sidewall of the extending portion of the contact hole 108.

The contact hole 108 is spaced apart from the digit line 104 as much as a hole-line distance Da. That is, an inner sidewall of the contact hole 108 is spaced apart from one sidewall of an adjacent digit line 104 as much as the hole-line distance Da. Preferably, the hole-line distance Da is 1F (F being minimum feature size). The contact plug 112 may be spaced farther apart from the digit line 104 than the hole-line distance Da by the insulation spacer 110.

Although not shown in the figure, a MOS transistor may be disposed below the first interlayer dielectric 102 as a switching element. The MOS transistor may include a gate electrode disposed on the substrate 100 with a gate insulation layer interposed therebetween and a source/drain region formed in opposite sides adjacent to the gate electrode. The gate electrode is parallel with the digit line 104 and may be disposed at the substrate 100 between the contact hole 108 and the digit line 104. A line width of the gate electrode may be 1F that is equal to the hole-line distance Da. The contact plug 112 is electrically connected to the source/drain region disposed at one side of the gate electrode. The digit line 104 is disposed over a source/drain region formed in the other side of the gate electrode.

If the contact hole 108 penetrates the second and first interlayer dielectrics 106 and 102 successively, the contact plug 112 may be in direct contact with the source/drain region. The insulation spacer 110 insulates the gate electrode from the contact plug 112. A gate spacer is disposed on both sidewalls of the gate electrode to insulate the insulation spacer 110 from the gate electrode.

Alternatively, the contact hole 108 penetrates only the second interlayer dielectric 106 to locate the contact plug 112 within the second interlayer dielectric 106. In this case, the contact plug 112 may be connected to the source/drain region via a lower plug (not shown) penetrating the first interlayer dielectric 102. Additionally, a conductive pad pattern (not shown) may be interposed between the contact plug 112 and the lower plug.

A bottom electrode 114 is disposed on the second interlayer dielectric 106 to be connected to the contact plug 112. The bottom electrode 114 extends laterally to cover the digit line 104. A plurality of bottom electrodes 114 are 2-dimensionally arranged on the second interlayer dielectric 106 in row and column directions. The row direction is parallel with an x-axis direction, and the column direction is parallel with a y-axis direction. The contact plug 112 is disposed below the respective bottom electrodes 114. The digit line 104 extends in the column direction to pass under the bottom electrodes 114 arranged in one of the column directions. The bottom electrode 114 and the digit line 104 are insulated from each other by the second interlayer dielectric 106.

Adjacent bottom electrodes 114 are spaced apart from one another in the column direction as much as an electrode-to-electrode distance Db and in the row direction as much as the electrode-to-electrode distance Db. Preferably, the electrode-to-electrode distance Db is 1F.

A planarized insulation layer 116a is disposed on the second interlayer dielectric 106 to fill spaces between the bottom electrodes 114. The planarized insulation layer 116a has a top surface coplanar with a top surface of the bottom electrode 114. The planarized insulation layer 116a prevents a step difference caused by a thickness of the bottom electrode 114.

A magnetic tunnel junction pattern (MTJ pattern) 126a is disposed on the bottom electrode 114. The MTJ pattern 126a is disposed over the digit line 104. That is, the MTJ pattern 126a overlaps the digit line 104. The MTJ pattern 126a includes a pinning pattern 118a, a pinned pattern 120a, a tunnel insulation pattern 122a, and a free pattern 124a that are stacked in that order. The pinning pattern 118a pins up a magnetization direction of the pinned pattern 120a. Accordingly, the magnetization direction of the pinned pattern 120a does not vary with magnetic fields applied externally. On the other hand, a magnetization direction of the free pattern 124a may vary relative to the magnetization direction of the pinned pattern 120a. In this case, the free pattern 124a has two stable magnetization directions, i.e., the same magnetization direction as the pinned pattern 120a and an opposite magnetization direction to the pinned pattern 120a.

In order to allow the free pattern 124a to have only the stable magnetization directions, the MTJ pattern 126a is 2-dimensionally rectangular preferably. For this reason, the free pattern 124a may have the two stable magnetization directions parallel with a major axis of the MTJ pattern 126a. In this embodiment, the major axis direction of the MTJ pattern 126a is parallel with the column direction. That is, the digit line 104 extends in the major axis direction of the MTJ pattern 126a. The contact hole 108 is spaced apart from the digit line 104 in a minor axis direction of the MTJ pattern 126a as much as the hole-line distance Da.

FIG. 3 illustrates the bottom electrodes 114 arranged in two column directions, i.e., a left column direction and a right column direction. Bottom electrodes 114 arranged in the right column direction are shown with a dotted line (hereinafter referred to as "right bottom electrodes"), and bottom electrodes 114 arranged in the left column direction are shown with a solid line (hereinafter referred to as "left bottom electrodes"). The right bottom electrodes 114 and associated MTJ patterns and contact holes may be arranged to be mirror-symmetric with respect to the left column directions 114, the MTJ pattern 126a, and the contact hole 118. Alternatively, the right bottom electrodes 114 and the MTJ patterns and contact holes may be arranged in the same direction as the left bottom electrodes 114, the MTJ patterns 126a, and the contact holes 108.

The MTJ patterns 126a are spaced apart from one another in the column direction (i.e., the major axis direction of the MTJ pattern 126a) as much as a pattern-to-pattern distance Dc. The contact holes 108 are spaced apart from one another in the column direction as much as a hole-to-hole distance Dd. The pattern-to-pattern distance Dc is equal to the electrode-to-electrode distance Db. Thus, a length L1 of a first width parallel with the column direction of the bottom electrode 114 becomes equal to a major axis length of the MTJ pattern 126a. In order to achieve high integration, minor and major axis lengths of the MTJ patterns 126a are preferably 1F and 2F, respectively. A width of the digit line 104 may be equal to or smaller than the minor axis length of the MTJ pattern 126a.

The bottom electrode 114 has a second width parallel with the row direction vertical to the column direction (i.e., the minor axis direction of the MTJ pattern 126a). In the column direction, a length L2 of the second width is preferably the sum of a width of the contact hole 108, the hole-line distance Da, and the width of the MTJ pattern 126a (i.e., the minor axis length of the MTJ pattern 126a). Thus, the length L2 may be determined to be 3F.

Preferably, a width of the contact hole 108 parallel with the column direction is equal to or smaller than the length L1 of the first width of the bottom electrode 114. Particularly, a width of the contact hole 108 parallel with the column direction may be 1F. In this case, the space between the contact holes 108 (i.e., the hole-to-hole distance) may be 2F.

A third interlayer dielectric 128 is disposed to cover an entire surface of a substrate 100 having the MTJ pattern 126a. The third interlayer dielectric 128 may have a top surface coplanar with a top surface of the MTJ pattern 126a. Accordingly, the third interlayer dielectric 128 may have a shape to cover the second interlayer dielectric 106 and the bottom electrode 114 and to surround a sidewall of the MTJ pattern 126a. In this case, a top surface of the MTJ pattern 126a is exposed.

A bitline 130 is disposed on the third interlayer dielectric 128 to be connected to the MTJ pattern 126a and to intersect the digit line 104. A width of the bitline 130 parallel with the column direction may be equal to or smaller than the major axis direction of the MTJ pattern 126a.

The third interlayer dielectric 128 may have a shape to cover the MTJ pattern 126a. In this case, the bitline 130 may be connected to the MTJ pattern 126a via a bitline contact hole (not shown) penetrating the third interlayer dielectric 128 to expose the MTJ pattern 126a.

According to the above-described embodiment, a magnetic memory cell having a plane area of $12F^2$ may be implemented. That is, since the electrode-to-electrode distance Db is 1F and the lengths L1 and L2 of the first and second widths of the bottom electrode 114 are 2F and 3F respectively, the magnetic memory cell has a plane area of $12F^2$.

In the magnetic memory device having the foregoing configuration, the electrode-to-electrode distance Db is equal to the pattern-to-pattern distance Dc in the major axis direction of the MTJ pattern 126a. Thus, the bottom electrode 114 does not include a misalign margin area between the bottom electrode 114 and the MTJ pattern 126a which may extend in the column direction. As a result, a plane area of a magnetic memory cell is reduced, and a high-integration magnetic memory device is realized.

In the minor axis direction of the MJT pattern 126a (i.e., the row direction), a length L2 of a second width of the bottom electrode 114 is equal to a width of the contact hole 108, the hole-line space Da, and a width of the MTJ pattern 126a (i.e., a length of a minor axis of the MTJ pattern 2126a). Thus, the bottom electrode 114 does not include a misalign margin area between the bottom electrode 114 that may extend in the row direction and the MTJ pattern 126a and a misalign margin area between the bottom electrode 114 and the contact hole 108. As a result, the plane area of the magnetic memory cell may be reduced more.

Figure 5:
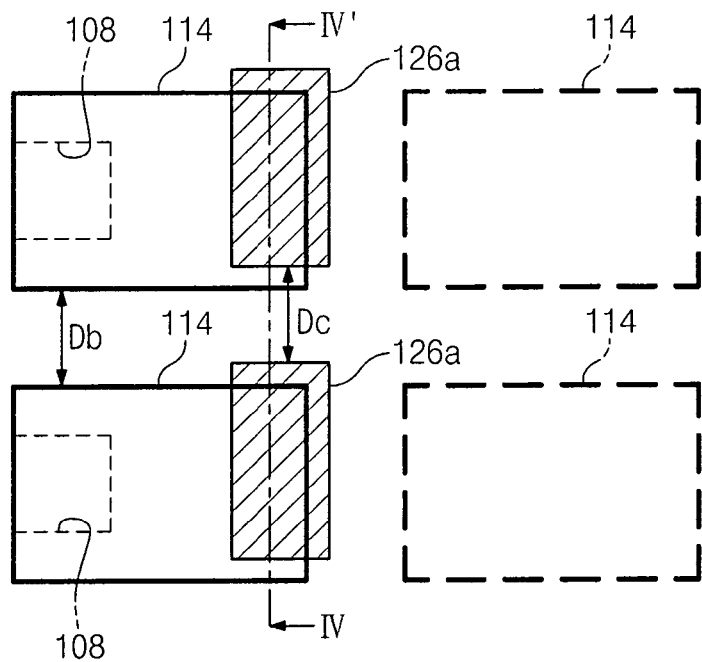
FIG. 5 is a top plan view showing misalignment of a bottom electrode and a magnetic tunnel junction pattern.
Figure 6:
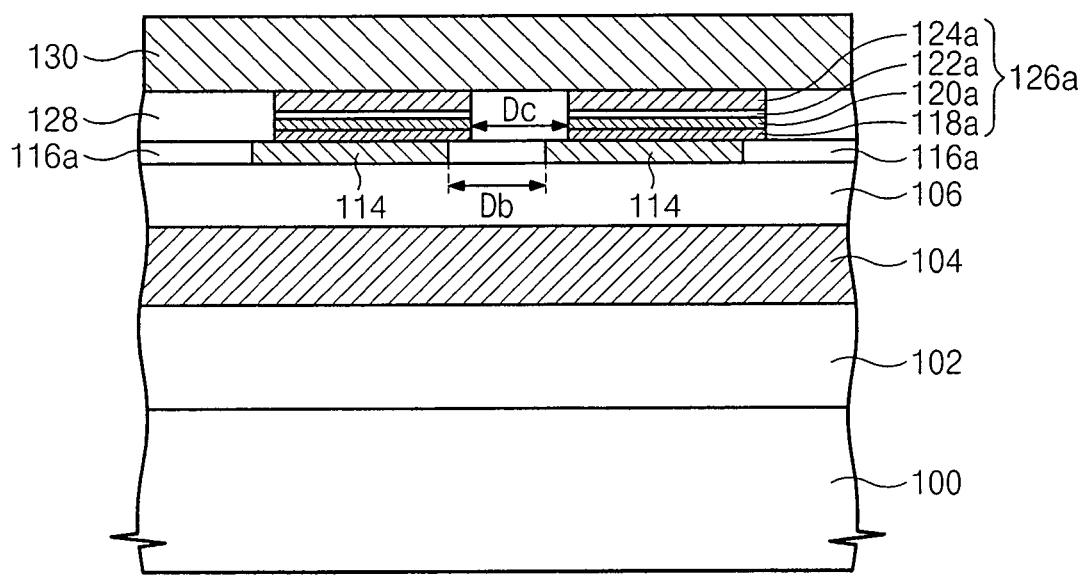
FIG. 6 is a cross-sectional view taken along a line IV-IV' of FIG. 5.

As illustrated in FIG. 5 and FIG. 6, a magnetic tunnel junction (MTJ) pattern 126a is misaligned with the bottom electrode 114. Resistance values for two stable states of the MTJ pattern 126a are much higher than contact resistance values between the MTJ pattern 126a and the bottom electrode 114. Thus, although a bottom surface of the MTJ pattern 126a is in partial contact with the bottom electrode 114 due to a misalignment, the magnetic memory device may perform normal operations (i.e., read operation, write operation and/or erase operation). Although the MTJ pattern 126a is misaligned with the bottom electrode, the pattern-to-pattern distance Dc is maintained which is equal to the electrode-to-electrode distance Db.

In spite of a misalignment, the MTJ pattern 126a is planarly maintained by the planarized insulation layer 116a to prevent degradation of the MTJ pattern 126a.

Although not shown in the figures, when the bottom electrode 114 is misaligned with the contact hole 108, it may be in contact with a portion of the top surface of the contact plug 112. In this case, since the resistance values for the two stable states of the MTJ pattern 126a are much higher than contact resistance values between the bottom electrode 114 and the contact plug 112, the magnetic memory device may perform normal operations.

FIGS. 7A, 8A, 9A and 10A are cross-sectional views, taken along a line II-II' of FIG. 3, illustrating a method of forming the magnetic memory device shown in FIG. 3. FIGS. 7B, 8B, 9B and 10B are cross-sectional views, taken along a line III-III' of FIG. 3, illustrating a method of forming the magnetic memory device shown in FIG. 3.

Figure 7A:
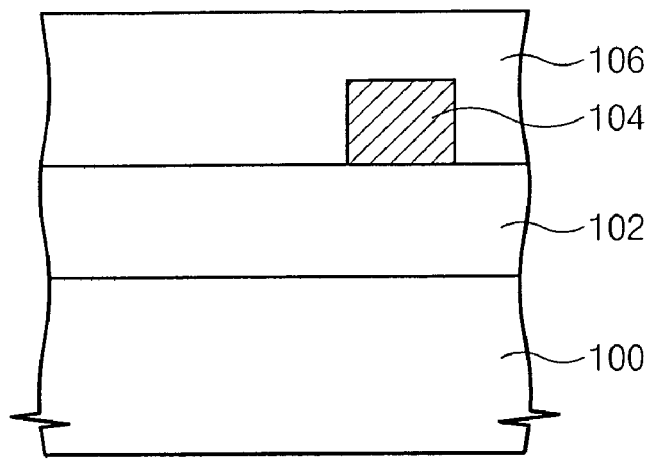
FIGS. 7A, 8A, 9A and 10A are cross-sectional views, taken along a line II-II' of FIG. 3, illustrating a method of forming the magnetic memory device shown in FIG. 3.
Figure 7B:
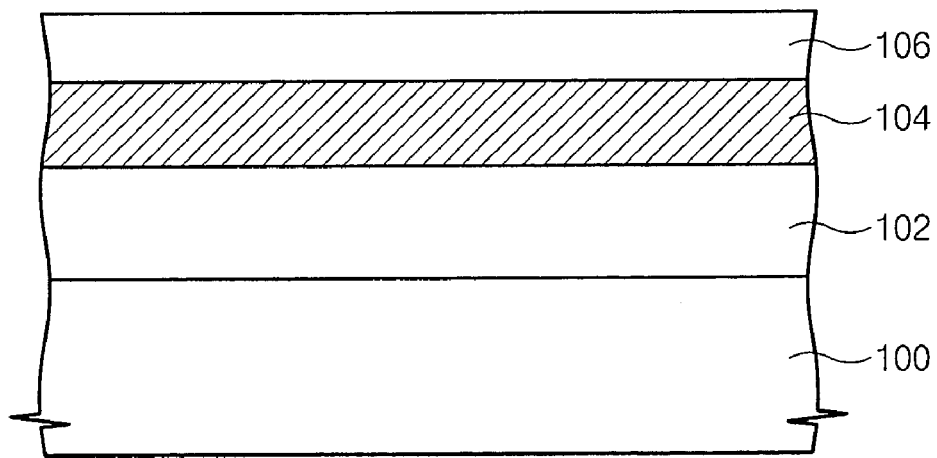
FIG. 7B, 8B, 9B and FIG. 10B are cross-sectional views, taken along a line III-III' of FIG. 3, illustrating a method of forming the magnetic memory device shown in FIG. 3.

Referring to FIG. 7A and FIG. 7B, a first interlayer dielectric 102 is formed on a substrate 100. A digit line 104 is formed over the first interlayer dielectric 102. The first interlayer dielectric 102 may be made of silicon oxide. The digit line 104 is made of a conductive material, e.g., metal such as tungsten.

A second interlayer dielectric 106 is formed on an entire surface of the substrate 100 having the digit line 104. The second interlayer dielectric 106 may be made of silicon oxide.

Figure 8A:
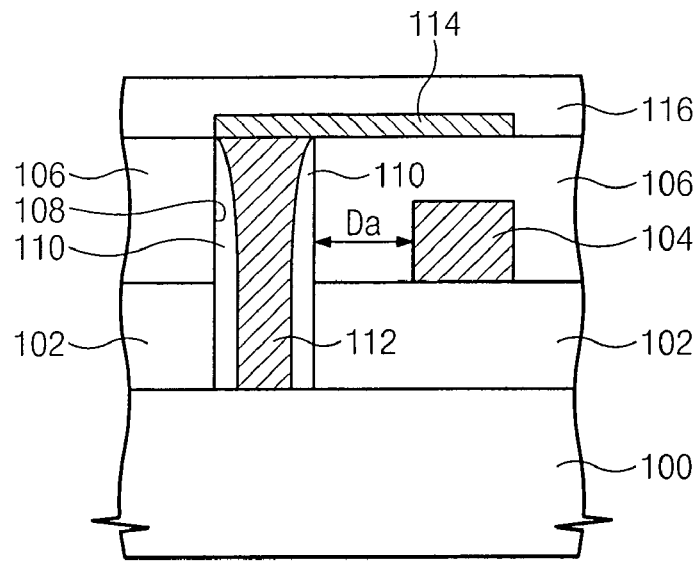
Figure 8B:
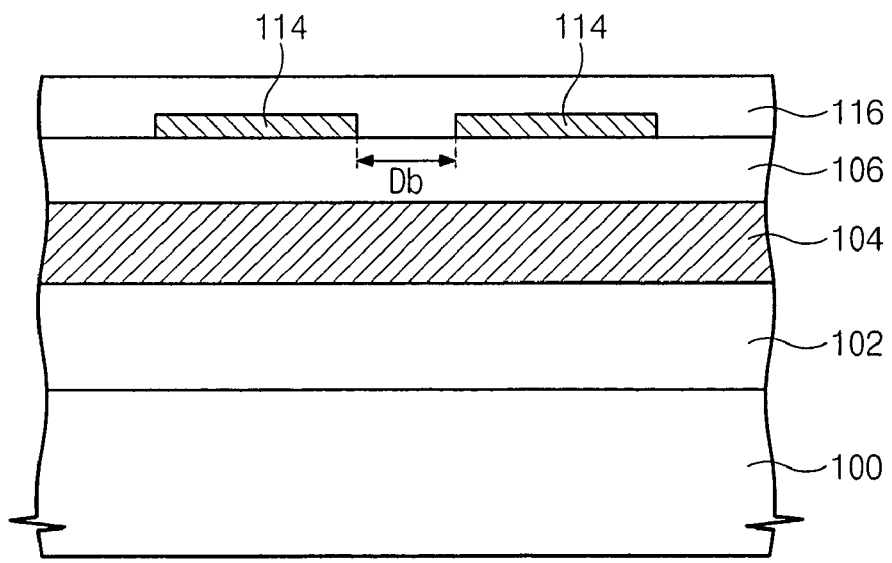

Referring to FIG. 3, FIG. 8A, and FIG. 8B, the second interlayer dielectric 106 is patterned to form a contact hole 108 spaced apart from the digit line 104 as much as a hole-line distance Da. The contact hole 108 may successively penetrate the second and first interlayer dielectrics 106 and 102 to expose the substrate 100. Alternatively, the first contact hole 108 may penetrate the first interlayer dielectric 102 to expose a lower plug (not shown) contacting the substrate 100 or a conductive pad pattern (not shown) formed on the bottom plug.

An insulation spacer 110 may be formed on an inner sidewall of the contact hole 108. The insulation spacer 110 may be made of silicon oxide, silicon nitride and/or silicon oxynitride.

A contact plug 112 is formed to fill the contact hole 108. The contact plug 112 has a top surface coplanar with the top surface of the second interlayer dielectric 106. The contact plug 112 is made of a conductive material. Specifically, the contact plug 112 may be made of conductive metal nitride (e.g., titanium nitride or tantalum nitride) and/or metal (e.g., tungsten).

A bottom electrode 114 is formed on the second interlayer dielectric 106 to be connected to the contact plug 112. The bottom electrode 114 is made of a conductive material. Specifically, the bottom electrode 114 may be made of conductive metal nitride such as titanium nitride or tantalum nitride. A plurality of bottom electrodes 114 are arranged on the second interlayer dielectric 106 in row and column directions, as shown in FIG. 3. The bottom electrodes 114 are spaced apart from one another in the row and column directions as much as an electrode-to-electrode distance Db.

An insulation layer 116 is formed on an entire surface of the substrate 100 having the bottom electrode 114. The insulation layer 116 may be made of silicon oxide, silicon nitride and/or silicon oxynitride.

Figure 9A:
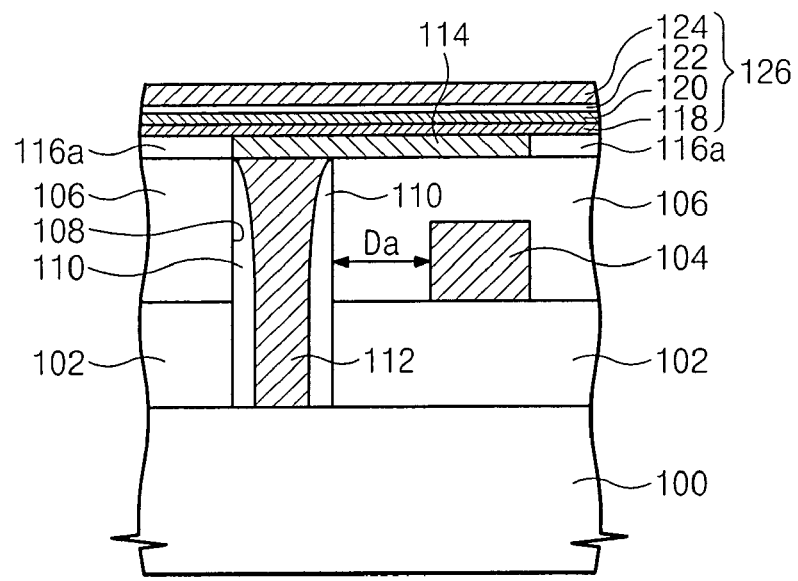
Figure 9B:
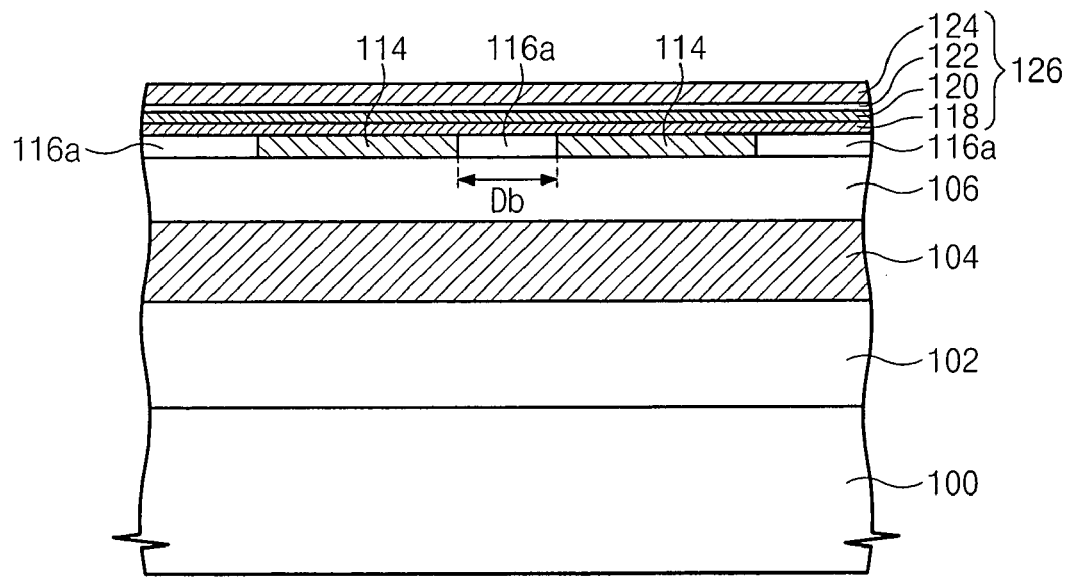

Referring to FIG. 9A and FIG. 9B, the insulation layer 116 is planarized until a top surface of the bottom electrode 114 is exposed. The planarization of the insulation layer 116 is preferably done using chemical mechanical polishing (CMP). Thus, the planarized insulation layer 116 fills spaces between the bottom electrodes 114 and has a top surface coplanar with the top surface of the bottom electrode 114.

A magnetic tunnel junction (MTJ) multi-layer 126 is formed on an entire surface of the substrate 100 having the planarized insulation layer 116a. The MJT multi-layer 126 includes a pinning layer 118, a pinned layer 120, a tunnel insulation layer 122, and a free layer 124 which are stacked in that order. The pinning layer 118 may be made of antiferromagnetic material. Specifically, the pinning layer 118 may be made of at least one material selected from the group consisting of IrMn, PtMn, MnO, MnS, MnTe, $MnF_2$, $FeF_2$, $FeCl_2$, FeO, $CoCl_2$, CoO, $NiCl_2$, NiO, and Cr. The pinned layer 120 and the free layer 124 may be made of ferromagnetic material. Specifically, the pined layer 120 and the free layer 124 may be made of at least one material selected from the group consisting of Fe, Co, Ni, Gd, Dy, MnAs, MnSb, $CrO_2$, $MnOFe_2O_3$, $NiOFe_2O_3$, $CuOFe_2O_3$, $MgOFe_2O_3$, $MgOFe_2O_3$, EuO, Ru, and $Y_3Fe_5O_{12}$. The pinned layer 120 and the free layer 124 may be made of different ferromagnetic materials. Alternatively, the pinned layer 120 and the free layer 124 may be of the same ferromagnetic materials. The tunnel insulation layer 122 may be made of aluminum oxide.

Figure 10A:
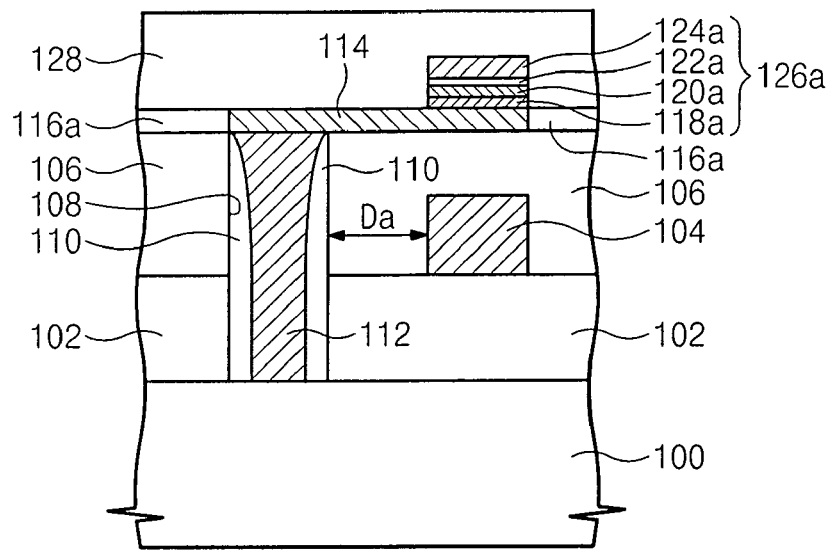
Figure 10B:
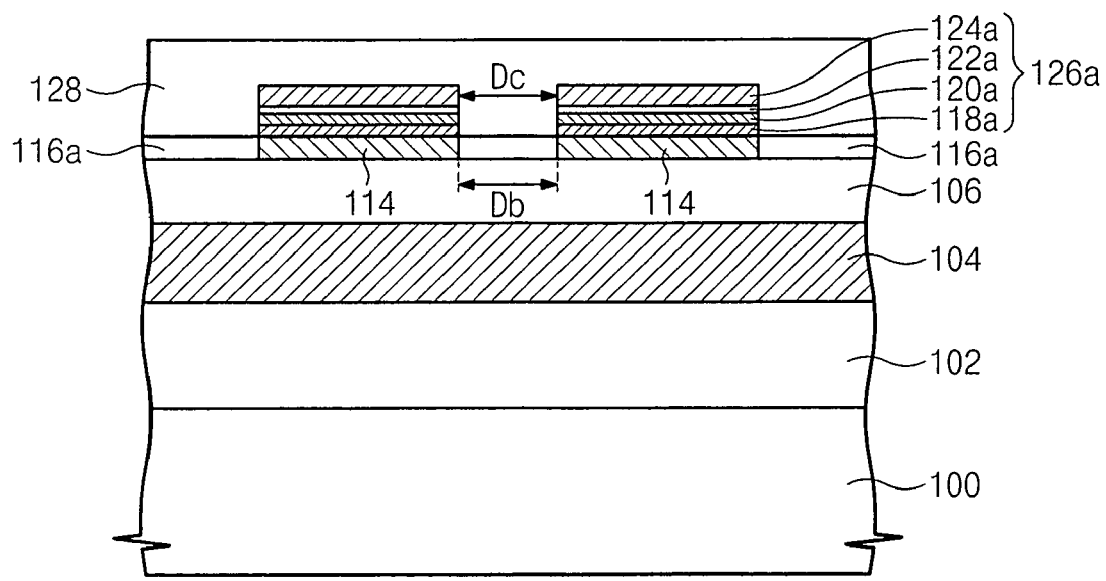

Referring to FIG. 3, FIG. 10A, and FIG. 10B, the layers of the MTJ multi-layer 126 are successively patterned to form a magnetic tunnel junction (MTJ) pattern 126a. The MTJ pattern 126a includes a pining pattern 118a, a pinned pattern 120a, a tunnel insulation pattern 122a, and a free pattern 124a which are stacked in that order. The MTJ pattern 126a is connected to the bottom electrode 114. As shown in FIG. 3, the MTJ patterns 126a are spaced apart from one another in the column direction as much as a pattern-to-pattern distance Dc. The pattern-to-pattern distance Dc is equal to the electrode-to-electrode distance Db.

Preferably, the MTJ pattern 126a is formed to be 2-dimensionally rectangular. A major axis direction of the MTJ pattern 126a is parallel with the column direction. The digit line 104 extends in a major axis direction (i.e., the column direction) of the MTJ pattern 126a. The contact hole 108 is formed to be spaced from the digit line 104 in a minor axis direction (the row direction) of the MTJ pattern 126a as much as the hole-line distance Da.

The pattern-to-pattern distance Dc is equal to the electrode-to-electrode distance Db, so that a length L1 of a first width of the bottom electrode 114 parallel with the column direction becomes equal to a major axis direction of the MTJ pattern 126a. In the minor axis direction (i.e., the column direction) of the MTJ pattern 126a, a length L2 of a second width of the bottom electrode 114 is preferably equal to the sum of a width of the contact hole 108, the hole-line distance Da, and a minor axis length of the MTJ pattern 126a.

A third interlayer dielectric 128 is formed on an entire surface of a substrate 100 having the MTJ pattern 126a. The third interlayer dielectric 128 may be made of silicon oxide. Alternatively, the third interlayer dielectric 128 may be made of another insulation material.

The third interlayer dielectric 128 is planarized until a top surface of the MTJ pattern 126a is exposed. A bitline 130 is formed to be connected to the exposed MTJ pattern 126a and to intersect the digit line 104. As a result, a magnetic memory device shown in FIG. 3, FIG. 4A, and FIG. 4B is implemented. Instead of the process for planarizing the third interlayer dielectric 128, the third interlayer dielectric 128 may be patterned to a bitline contact hole (not shown) exposing the MTJ pattern 126a. In this case, the bitline 130 is connected to the MTJ pattern 126a via the bitline contact hole. The bitline 130 is made of a conductive material, e.g., metal such as tungsten.

EMBODIMENT 2

A higher-integration magnetic memory device will be described hereinafter.

Figure 11:
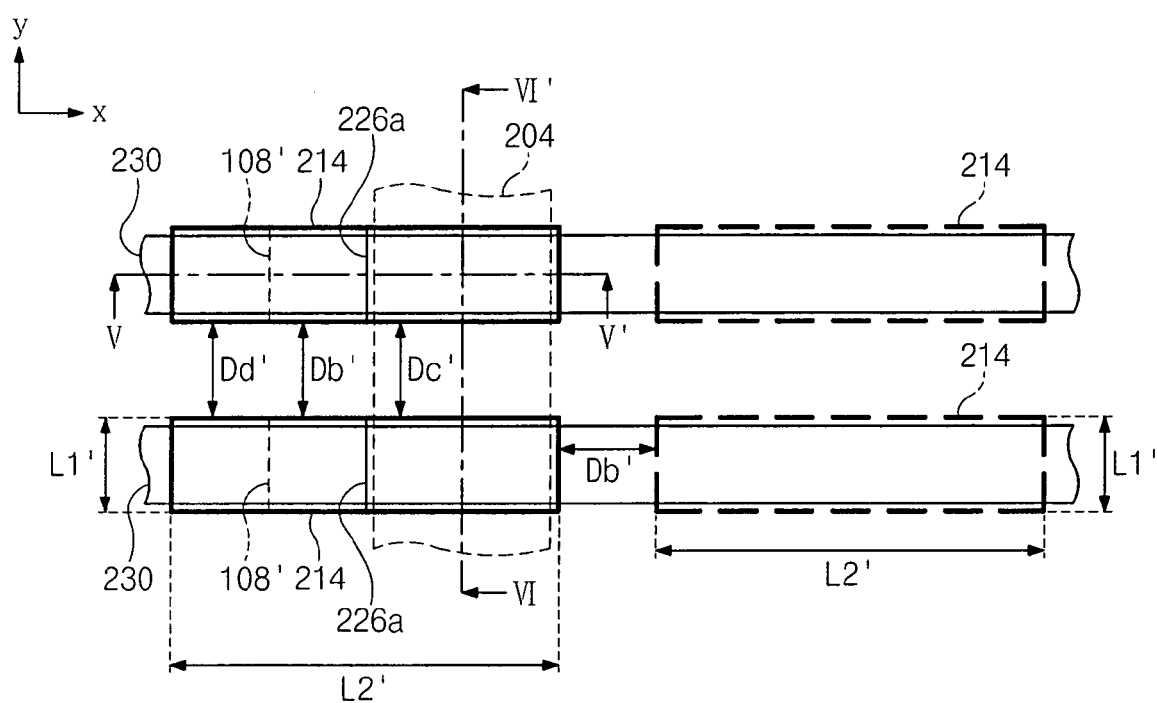
FIG. 11 is a top plan view of a magnetic memory device according to another embodiment of the present invention.
Figure 12A:
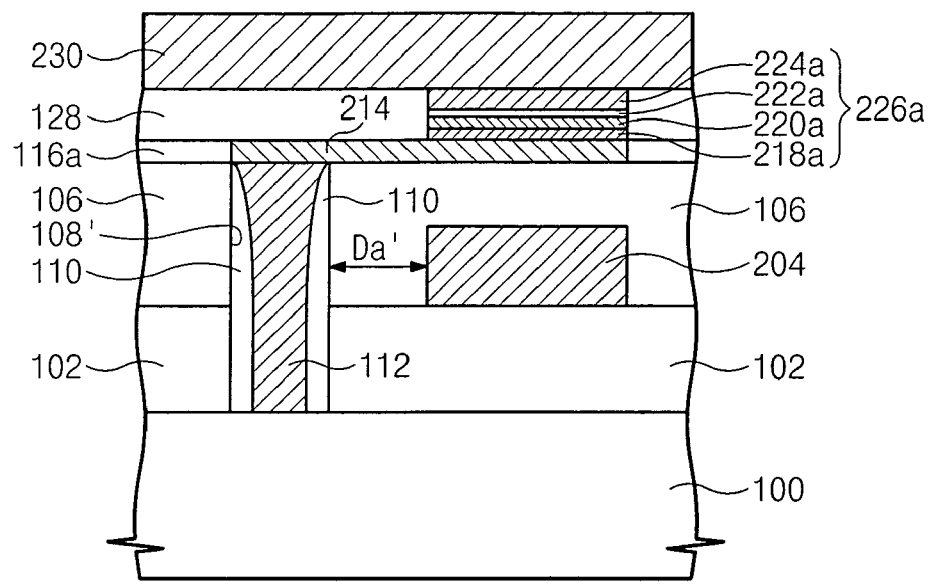
FIG. 12A is a cross-sectional view taken along a line V-V' of FIG. 11.

FIG. 11 is a top plan view of a magnetic memory device according to another embodiment of the present invention. FIG. 12A is a cross-sectional view taken along a line V-V' of FIG. 11, and FIG. 12B is a cross-sectional view taken along a line VI-VI' of FIG. 11.

Figure 12B:
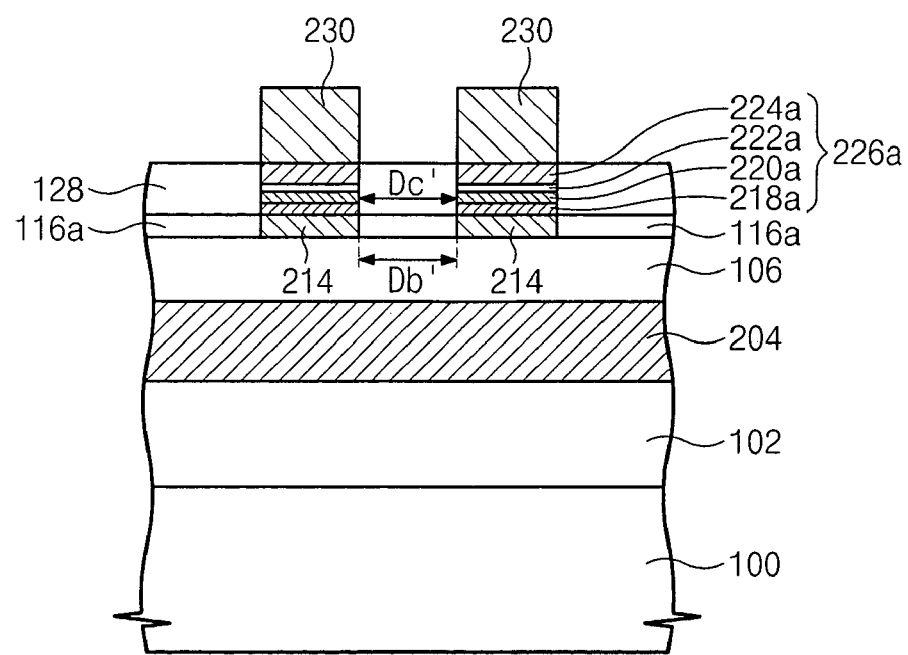
FIG. 12B is a cross-sectional view taken along a line VI-VI' of FIG. 11.

Referring to FIG. 11, FIG. 12A, and FIG. 12B, a first interlayer dielectric 102 is disposed on a substrate 100. A digit line 204 is disposed over the first interlayer dielectric 102. A second interlayer dielectric 106 is disposed to cover the first interlayer dielectric 102 and the digit line 204.

A contact hole 108' is disposed to penetrate the second interlayer dielectric 106. The contact hole 108' is spaced apart from the digit line 204 as much as a hole-line distance Da'. In order to achieve high integration, the hole-line distance Da' is 1F preferably. A contact plug 112 fills the contact hole 108'. An insulation spacer 110 may be disposed on an inner sidewall of the contact hole 108'. The insulation spacer 110 is interposed between the contact plug 112 and the inner sidewall of the contact hole 108'. As previously described in the first embodiment, the contact hole 108' may extend downwardly and penetrate the first interlayer dielectric 102 to expose the substrate 100. Alternatively, the contact hole 108' may penetrate the first interlayer dielectric 102 to expose a lower plug (not shown) connected to the substrate 100 or a conductive pad pattern (not shown) formed on the bottom plug.

As previously described in the first embodiment, a MOS transistor (not shown) may be disposed below the first interlayer dielectric 102 as a switching element. The contact hole 108' and the contact plug 112 may be connected to the MOS transistor using the same manner as described in the first embodiment.

A bottom electrode 214 is disposed on the second interlayer dielectric 106 to be connected to the contact plug 112. The bottom electrode 214 extends laterally to cover the digit line 204. A plurality of bottom electrodes 214 are 2-dimensionally arranged on the second interlayer dielectric 106 in row and column directions. The column direction is parallel with an x-axis direction, and the column direction is parallel with a y-axis direction. The bottom electrodes 214 are spaced apart from one another in the row and column directions as much as an electrode-to-electrode distance Db. In order to achieve high integration, the electrode-to-electrode distance Db is 1F preferably.

The digit line 204 extends in the column direction to pass under the bottom electrodes 214 arranged in one of the column directions. The bottom electrode 214 and the digit line 204 are insulated by the second interlayer dielectric to be spaced apart from each other.

A planarized insulation layer 116a is disposed on the second interlayer dielectric 106 to fill spaces between the bottom electrodes 214. The planarized insulation layer 116a has a top surface coplanar with a top surface of the bottom electrode 214.

A magnetic tunnel junction pattern (MTJ pattern) 226a is disposed on the bottom electrode 214. The MTJ pattern 126a is disposed over the digit line 204. Thus, the MTJ pattern 226a and the digit line 204 overlap each other. The MTJ pattern 226a includes a pinning pattern 218a, a pinned pattern 220a, a tunnel insulation pattern 222a, and a free pattern 224a that are stacked in that order. The pinning pattern 218a pins up a magnetization direction of the pinned pattern 220a. Accordingly, the magnetization direction of the pinned pattern 220a does not vary with magnetic fields applied externally. On the other hand, a magnetization direction of the free pattern 224a may change into the two stable magnetization directions described in the first embodiment.

Preferably, the MTJ pattern 226a is 2-dimentioally rectangular. A minor axis direction of the MTJ pattern 226a is parallel with the column direction. The digit line 204 extends in a minor axis direction of the MTJ pattern 226a, and the contact hole 108' is spaced apart from the digit line 204 in a major axis direction of the MTJ pattern 226a.

The MTJ patterns 226a are spaced apart from one another in the column direction (i.e., the minor axis direction of the MTJ pattern 226a) as much as a pattern-to-pattern distance Dc'. The contact holes 108' are spaced apart from one another in the column direction as much as a hole-to-hole distance Dd'. The pattern-to-pattern distance Dc' is equal to the electrode-to-electrode distance Db', so that a length L1' of a first width parallel with the column direction of the bottom electrode 114 becomes equal to a major axis length of the MTJ pattern 226a. Further, the hole-to-hole distance Dd' is preferably equal to the electrode-to-electrode distance Db', so that the length L1' becomes equal to the width of the contact hole 108' parallel with the column direction.

In order to achieve high integration, the electrode-to-electrode distance Db' is preferably 1F, and minor and major axis lengths of the MTJ patterns 226a are preferably 1F and 2F, respectively. As a result, the length L1' of the first width of the bottom electrode 214 and the width of the contact hole 108' parallel with the column direction become 1F, respectively. The width of the digit line 204 may be equal to or smaller than the major direction length of the MTJ pattern 226a.

In FIG. 11, the bottom electrodes 214 (shown with a dotted line) arranged in a right column direction, MTJ patterns, and contact holes are mirror-symmetric with respect to the bottom electrodes 214 (shown with a solid line) arranged in a left column direction, the MTJ patterns 226a, and the contact holes 108.

The bottom electrode 214 has a second width along the row direction vertical to the column direction. In the column direction (i.e., the major axis direction of the MTJ pattern 226a), a length L2 of the second width is preferably equal to the sum of a width the contact hole 108, the hole-line distance Da', and the with of the MTJ pattern 226a (i.e., the major axis length of the MTJ pattern 226a). Preferably, a width of the contact hole 108 parallel with the row direction is 1F. Thus, the length L2 of the second width of the bottom electrode 214 may be decided as 4F.

A third interlayer dielectric 128 is disposed to cover an entire surface of the substrate 100 having the MTJ pattern 226a. The third interlayer dielectric 128 has a top surface coplanar with a top surface of the MTJ pattern 226a. Therefore, the top surface of the MTJ pattern 226a may be exposed. A bitline 230 is disposed on the third interlayer dielectric 128 to be connected to the MTJ pattern 226a. The bitline 230 intersects the digit line 204. A width of the bitline 230 may be equal to or smaller than the minor axis length of the MTJ pattern 226a.

According to the above-described embodiment, a magnetic memory cell having a plane area of $10F^2$ may be implemented. That is, the electrode-to-electrode distance Db' is 1F, and the lengths L1' and L2' of the first and second widths of the bottom electrode 214 are 1F and 4F respectively. Thus, the magnetic memory cell may have a plane area of $10F^2$.

For the magnetic memory device having the foregoing configuration, in the column direction (i.e., the minor axis direction of the MTJ pattern 226a), the electrode-to-electrode distance Db' is equal to the pattern-to-pattern distance Dc'.

Thus, the bottom electrode 214 does not include a misalign margin area between the bottom electrode 214 extending in the column direction and the MTJ pattern 226a. In the column direction, the electrode-to-electrode distance Db' is equal to the hole-to-hole distance Dd'. Thus, the bottom electrode 214 does not include a misalign margin area between the bottom electrode 214 extending in the column direction and the contact hole 108'. As a result, a plane area of the bottom electrode is considerably reduced to implement a high-integration magnetic memory device.

In the row direction, the length L2' of the second width of the bottom electrode 214 is equal to the sum of the width of the contact hole 108', the hole-line distance Da', and the width of the MTJ pattern 226a (i.e., the major axis length of the MTJ pattern 226a). Thus, the bottom electrode does not include a misalign margin area between the bottom electrode 214 extending in the row direction and the contact hole 108 as well as a misalign margin area between the bottom electrode 214 and the MTJ pattern 226a. As a result, the plane area of the magnetic memory cell may be reduced more.

Figure 13A:
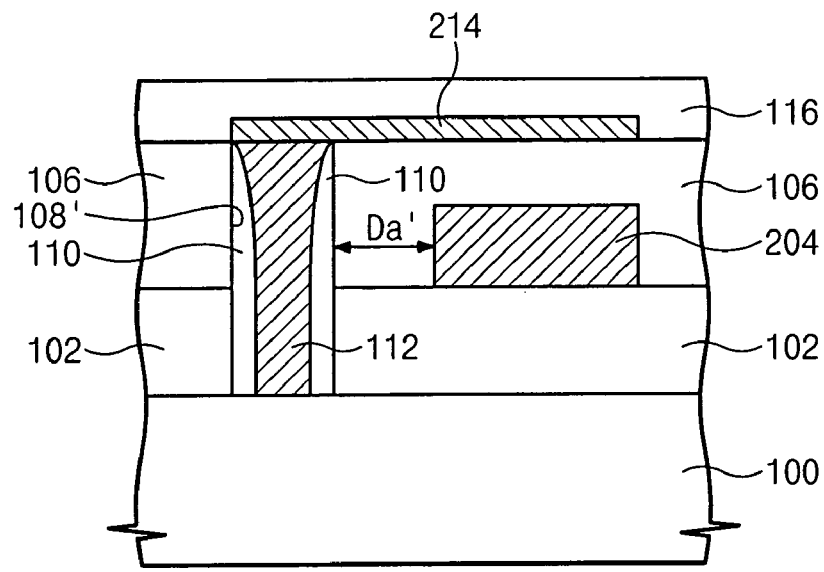
FIG. 13A and FIG. 14A are cross-sectional views, taken along a line V-V' of FIG. 11, illustrating a method of forming the magnetic memory device shown in FIG. 11.
Figure 13B:
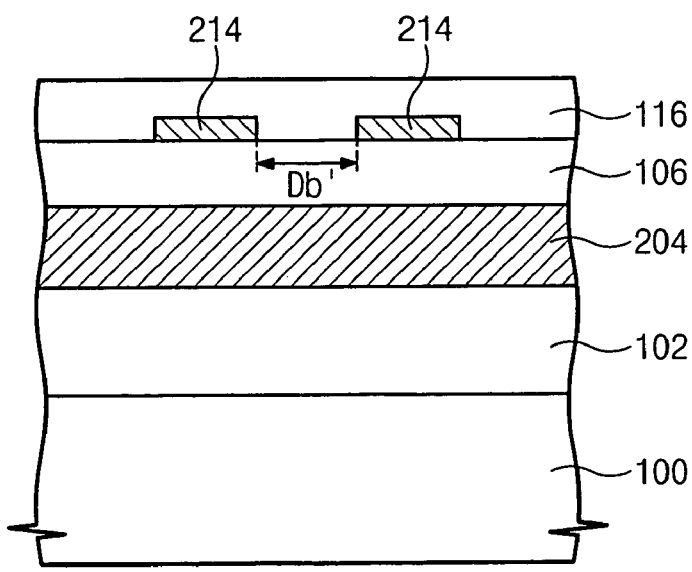
FIG. 13B and FIG. 14B are cross-sectional views, taken along a line VI-VI' of FIG. 11, illustrating a method of forming the magnetic memory device shown in FIG. 11.
Figure 14A:
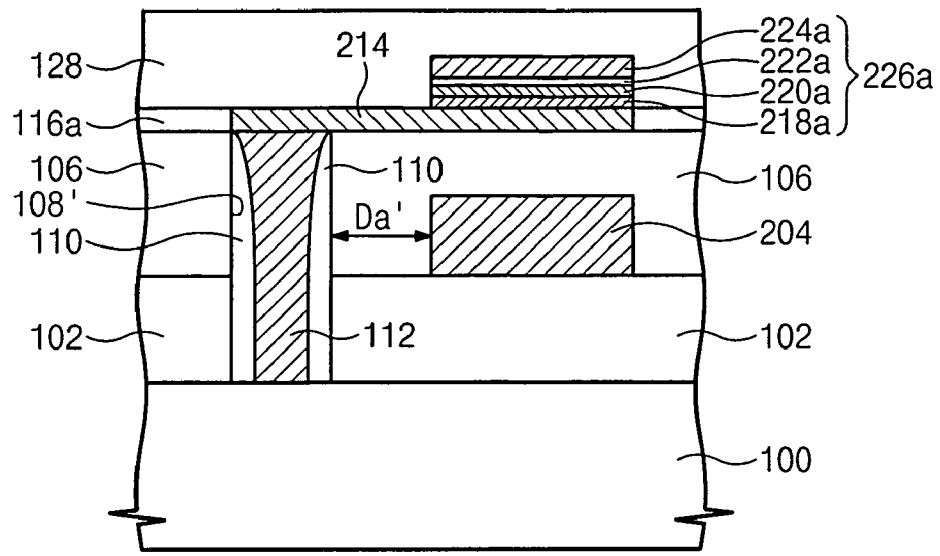
Figure 14B:
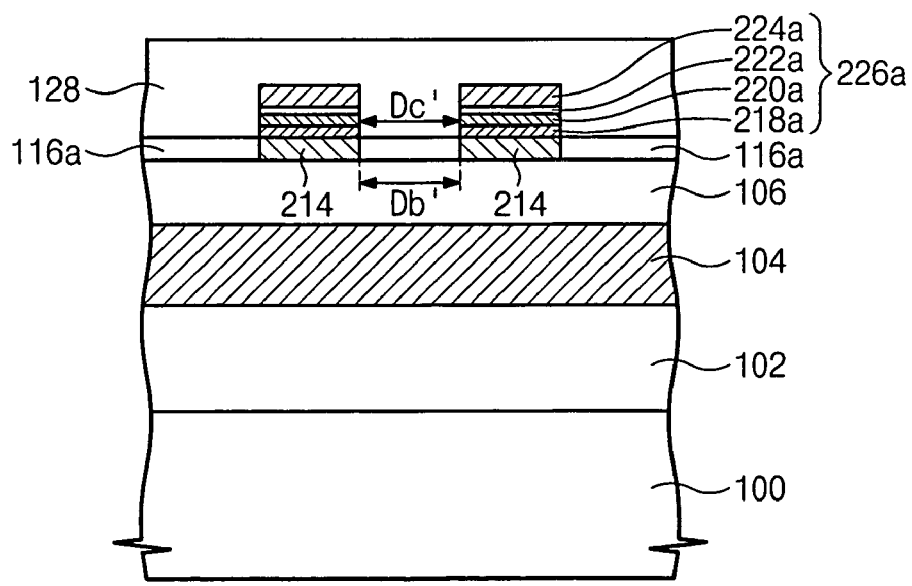

FIG. 13A and FIG. 14A are cross-sectional views, taken along a line V-V' of FIG. 11, illustrating a method of forming the magnetic memory device shown in FIG. 11. FIG. 13B and FIG. 14B are cross-sectional views, taken along a line VI-VI' of FIG. 11, illustrating a method of forming the magnetic memory device shown in FIG. 11.

Referring to FIG. 11, FIG. 13A, and FIG. 13B, a first interlayer dielectric 102 is formed on a substrate 100. A digit line 204 is formed over the first interlayer dielectric 102. The digit line 204 may be made of a conductive material, e.g., metal such as tungsten. A second interlayer dielectric 106 is formed on an entire surface of a substrate 100 having the digit line 204.

The second interlayer dielectric 106 is patterned to form a contact hole 108' spaced apart from the digit line 204 as much as a hole-line distance Da'. Preferably, the hole-line distance Da' is 1F. As previously described in the first embodiment, the contact hole 108' may successively penetrate the second and first interlayer dielectrics 106 and 102 to expose the substrate 100. Alternatively, the contact hole 108' may penetrate the first interlayer dielectric 102 to expose a lower plug (not shown) connected to the substrate 100 or a conductive pad pattern (not shown) formed on the lower pattern. An insulation spacer 110 may be formed on an inner sidewall of the contact hole 108'. A contact plug 112 is formed to fill the contact hole 108'.

A bottom electrode 214 is formed on the second interlayer dielectric 106 to be connected to the contact plug 112. The bottom electrode 214 extends laterally to cover the digit line 204. The bottom electrode 214 is made of a conductive material. Specifically, the bottom electrode 214 may be made of a conductive metal nitride such as titanium nitride or tantalum nitride. A plurality of bottom electrodes 214 are formed on the second interlayer dielectric 106 to be arranged in row and column directions, as shown in FIG. 11. The bottom electrodes, 106 are spaced apart from one another in the row and column directions as much as an electrode-to-electrode distance Db'. The contact holes 108' are spaced apart from one another in the column direction as much as a hole-to-hole distance Dd'. Preferably, the hole-to-hole distance Dd' is equal to the electrode-to-electrode distance Db'. Preferably, the electrode-to-electrode distance Db' is 1F. The digit line 204 extends in the column direction.

An insulation layer 116 is formed on an entire surface of the substrate 100 having the bottom electrode 214.

Referring to FIG. 11, FIG. 14A, and FIG. 14B, the insulation layer 116 is planarized until the bottom electrode 214 is exposed. Preferably, the planarization of the insulation layer 116 is done using chemical mechanical polishing (CMP). Thus, the planarized insulation layer 16a fills spaces between the bottom electrodes 114 and has a top surface coplanar with a top surface of the bottom electrode 114.

A magnetic tunnel junction (MTJ) pattern 226a is formed on a substrate 100 having the planarized insulation layer 116a to be connected to the bottom electrode 214. The MTJ patterns 226a are spaced apart from one another in the column direction as much as a pattern-to-pattern distance Dc'. The pattern-to-pattern distance Dc' is equal to the electrode-to-electrode distance Db'.

Preferably, the MTJ pattern 226a is rectangular. In this case, a minor axis direction of the MTJ pattern 226a is parallel with the column direction. That is, the digit line 204 extends in the minor axis direction of the MTJ pattern 226a. The contact hole 108' is spaced apart from the digit line 204 in the major axis direction of the MTJ pattern 226a as much as the hole-line distance Da'.

The pattern-to-pattern distance Dc' is equal to the electrode-to-electrode distance Db', so that a length L1' of a first width of the bottom electrode 214 parallel with the column direction becomes equal to the minor axis length of the MTJ pattern 214. The hole-to-hole distance Dd' is equal to the electrode-to-electrode distance Db', so that a width of the contact hole 108' parallel with the column direction becomes equal to the length L1' of the first width of the bottom electrode 214.

In the column direction, a length L2 of a second width of the bottom electrode 214 is preferably equal to the sum of the width of the contact hole 108, the hole-to-line distance Da', and the major axis length of the MTJ pattern 226a. Preferably, the major and minor axis lengths of the MTJ pattern 226a are 1F and 2F, respectively. Thus, the lengths L1' and L2' of the first and second widths of the bottom electrode 214 becomes 1F and 4F, respectively.

The magnetic tunnel junction (MTJ) pattern 226a includes a pinning pattern 218a, a pinned pattern 220a, a tunnel insulation pattern 222a, and a free pattern 224a which are stacked in that order. The pinning pattern 218a may be made of antiferromagnetic material. Specifically, the pinning layer 218a may be made of at least one material selected from the group consisting of IrMn, PtMn, MnO, MnS, MnTe, $MnF_2$, $FeF_2$, $FeCl_2$, FeO, $CoCl_2$, CoO, $NiCl_2$, NiO, and Cr. The pinned pattern 220a and the free pattern 224a may be made of ferromagnetic material. Specifically, the pined pattern 220a and the free pattern 224a may be made of at least one material selected from the group consisting of Fe, Co, Ni, Gd, Dy, MnAs, MnSb, $CrO_2$, $MnOFe_2O_3$, $NiOFe_2O_3$, $CuOFe_2O_3$, $MgOFe_2O_3$, $MgOFe_2O_3$, EuO, Ru, and $Y_3Fe_5O_{12}$. The pinned pattern 220a and the free pattern 224a may be made of different ferromagnetic materials. Alternatively, the pinned pattern 220a and the free pattern 224a may be of the same ferromagnetic material. The tunnel insulation pattern 222a may be made of aluminum oxide.

A third interlayer dielectric 128 is formed on an entire surface of a substrate 100 having the MTJ pattern 226a. The third interlayer dielectric 128 is planarized until a top surface of the MTJ pattern 226a is exposed. A bitline 230 is formed on the third interlayer dielectric 128. The bitline 230 is connected to the MTJ pattern 226a and intersects the digit line. As a result, a magnetic memory device shown in FIG. 11, FIG. 12A, and FIG. 12B may be implemented. The planarization of the third interlayer dielectric 128 may be omitted. In this case, the bitline 230 may be connected to the MTJ pattern 226a via a bitline contact hole (not shown) penetrating the second interlayer dielectric 128. The bitline 230 may be made a conductive material including a metal such as, for example, tungsten.

As described herein, bottom electrodes are disposed to be connected to magnetic tunnel junction (MTJ) patterns, respectively. The bottom electrodes are spaced apart from one another in a column direction as much as an electrode-to-electrode distance, and the MTJ patterns are spaced apart from one another in the column direction as much as a pattern-to-pattern distance. Since the electrode-to-electrode distance is equal to the pattern-to-pattern distance, the bottom electrode does not include a misalign margin area between the bottom electrode extending in the column direction and the MTJ pattern. Thus, a plane area of the bottom electrode is reduced to implement a high-integration magnetic memory device.

Further, in a row direction vertical to the column direction, a width of the bottom electrode is equal to the sum of a width of the contact hole, a distance between the contact hole and a digit line, and a width of the MTJ pattern. Thus, the bottom electrode does not include a misalign margin area between the bottom electrode extending in the column direction and the MTJ pattern as well as a misalign margin area between the bottom electrode and the contact hole. As a result, a plane area of the bottom electrode may be reduced more.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A magnetic memory device comprising:
   bottom electrodes disposed over an interlayer dielectric formed on a substrate, the bottom electrodes being arranged in one direction to be spaced apart from one another as much as a first distance;
   a planarized insulation layer filling a space between the bottom electrodes and having a top surface coplanar with a top surface of the bottom electrodes; and
   magnetic tunnel junction (MTJ) patterns arranged in the one direction to be spaced apart from one another as much as a second distance, the MTJ patterns being connected to the bottom electrodes, respectively,
   wherein the first distance is equal to the second distance.

2. The magnetic memory device of claim 1, further comprising a digit line disposed below the bottom electrodes to overlap the MTJ patterns, wherein the interlayer dielectric covers the digit line, and the digit line extends in the one direction.

3. The magnetic memory device of claim 2, further comprising: a contact plug disposed to be spaced apart from the digit line as much as a third distance in a vertical direction with respect to the one direction to fill a contact hole penetrating the interlayer dielectric, the contact plug being connected to a bottom surface of the bottom electrode, wherein a length of the bottom electrode disposed in the vertical direction is equal to the sum of a width of the contact hole, the third distance, and a width of the MTJ pattern.

4. The magnetic memory device of claim 1, further comprising a bitline connected to MTJ pattern to intersect the digit line.

5. The magnetic memory device of claim 1, wherein the MTJ pattern is rectangular, and a major axis direction of the MTJ pattern is parallel with the one direction.

6. The magnetic memory device of claim 5, further comprising a digit line disposed below the bottom electrodes to overlap the MTJ patterns, wherein the interlayer dielectric covers the digit line, and the digit line extends in the major axis direction of the MTJ pattern.

7. The magnetic memory device of claim 6, further comprising a contact plug spaced apart from the digit line in a minor axis direction of the MTJ pattern as much as a third distance to fill the contact hole penetrating the interlayer dielectric, the contact plug being connected to the bottom surface of the bottom electrode, wherein in the minor axis direction of the MTJ pattern, a length of the bottom electrode is equal to the sum of the width of the contact hole, the third distance, and a minor axis distance of the MTJ pattern.

8. The magnetic memory device of claim 5, further comprising a bitline connected to the MTJ pattern to intersect the digit line.

9. The magnetic memory device of claim 1, wherein the MTJ pattern is rectangular, and the minor axis direction of the MTJ pattern is parallel with the one direction.

10. The magnetic memory device of claim 1, further comprising a digit line disposed below the bottom electrodes to overlap the MTJ patterns, wherein the interlayer dielectric covers the digit line, and the digit line extends in the minor axis direction of the MTJ pattern.

11. The magnetic memory device of claim 10, further comprising a contact plug spaced apart from the digit line in the major axis direction of the MTJ pattern as much as a third distance to fill a contact hole penetrating the interlayer dielectric, the contact plug being connected to the bottom surface of the bottom electrode, wherein in the major axis direction of the MTJ pattern, a length of the bottom electrode is equal to the sum of a width of the contact hole, the third distance, and a major axis length of the MTJ pattern.

12. The magnetic memory device of claim 11, wherein the contact holes are spaced apart from one another in the minor axis direction of the MTJ pattern as much as a fourth distance that is equal to the first distance.

13. The magnetic memory device of claim 9, further comprising a bitline connected to the MTJ pattern to intersect the digit line.

14. A magnetic memory device comprising:
   bottom electrodes disposed over an interlayer dielectric formed on a substrate, the bottom electrodes being arranged in one direction to be spaced apart from one another as much as a first distance;
   a planarized insulation layer filling a space between the bottom electrodes and having a top surface coplanar with a top surface of the bottom electrodes;
   magnetic tunnel junction (MTJ) patterns arranged in the one direction to be spaced apart from one another as much as a second distance, the MTJ patterns being connected to the bottom electrodes, respectively, wherein the first distance is equal to the second distance;
   a digit line disposed below the bottom electrodes to overlap the MTJ patterns, wherein the interlayer dielectric covers the digit line, and the digit line extends in the one direction; and
   a contact plug disposed to be spaced apart from the digit line as much as a third distance in a vertical direction with respect to the one direction to fill a contact hole penetrating the interlayer dielectric, the contact plug being connected to a bottom surface of the bottom electrode, wherein a length of the bottom electrode disposed in the vertical direction is equal to the sum of a width of the contact hole, the third distance, and a width of the MTJ pattern.

15. A magnetic memory device comprising:

bottom electrodes disposed over an interlayer dielectric formed on a substrate, the bottom electrodes being arranged in one direction to be spaced apart from one another as much as a first distance;

a planarized insulation layer filling a space between the bottom electrodes and having a top surface coplanar with a top surface of the bottom electrodes;

magnetic tunnel junction (MTJ) patterns arranged in the one direction to be spaced apart from one another as much as a second distance, the MTJ patterns being connected to the bottom electrodes, respectively, wherein:

the first distance is equal to the second distance, and the MTJ pattern is rectangular, and a major axis direction of the MTJ pattern is parallel with the one direction;

a digit line disposed below the bottom electrodes to overlap the MTJ patterns, wherein the interlayer dielectric covers the digit line, and the digit line extends in the major axis direction of the MTJ pattern; and a contact plug spaced apart from the digit line in a minor axis direction of the MTJ pattern as much as a third distance to fill the contact hole penetrating the interlayer dielectric, the contact plug being connected to the bottom surface of the bottom electrode, wherein in the minor axis direction of the MTJ pattern, a length of the bottom electrode is equal to the sum of the width of the contact hole, the third distance, and a minor axis distance of the MTJ pattern.

16. A magnetic memory device comprising:

bottom electrodes disposed over an interlayer dielectric formed on a substrate, the bottom electrodes being arranged in one direction to be spaced apart from one another as much as a first distance;

a planarized insulation layer filling a space between the bottom electrodes and having a top surface coplanar with a top surface of the bottom electrodes;

magnetic tunnel junction (MTJ) patterns arranged in the one direction to be spaced apart from one another as much as a second distance, the MTJ patterns being connected to the bottom electrodes, respectively, wherein the first distance is equal to the second distance;

a digit line disposed below the bottom electrodes to overlap the MTJ patterns, wherein the interlayer dielectric covers the digit line, and the digit line extends in the minor axis direction of the MTJ pattern; and a contact plug spaced apart from the digit line in the major axis direction of the MTJ pattern as much as a third distance to fill a contact hole penetrating the interlayer dielectric, the contact plug being connected to the bottom surface of the bottom electrode, wherein in the major axis direction of the MTJ pattern, a length of the bottom electrode is equal to the sum of a width of the contact hole, the third distance, and a major axis length of the MTJ pattern.

17. The magnetic memory device of claim 16, wherein the contact holes are spaced apart from one another in the minor axis direction of the MTJ pattern as much as a fourth distance that is equal to the first distance.

* * * * *